(12) United States Patent
Im

(10) Patent No.: US 7,936,207 B2
(45) Date of Patent: May 3, 2011

(54) INTERNAL VOLTAGE GENERATOR

(75) Inventor: Jae-Hyuk Im, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 22 days.

(21) Appl. No.: 12/343,946

(22) Filed: Dec. 24, 2008

(65) Prior Publication Data

US 2010/0109762 A1    May 6, 2010

(30) Foreign Application Priority Data

Nov. 6, 2008  (KR) .................. 10-2008-0110039

(51) Int. Cl.
*G05F 1/46* (2006.01)
(52) U.S. Cl. ................ 327/541; 327/543; 323/314
(58) Field of Classification Search ............... None
See application file for complete search history.

(56) References Cited

U.S. PATENT DOCUMENTS

| | | | | |
|---|---|---|---|---|
| 5,355,033 A * | 10/1994 | Jang | ............................ | 326/83 |
| 5,552,739 A * | 9/1996 | Keeth et al. | .................... | 327/538 |
| 6,768,370 B2 * | 7/2004 | Takahashi et al. | ............. | 327/540 |
| 6,774,712 B2 * | 8/2004 | Rhee et al. | .................... | 327/540 |
| 7,221,213 B2 * | 5/2007 | Lee et al. | ...................... | 327/541 |
| 7,414,458 B2 * | 8/2008 | Wu et al. | ...................... | 327/540 |

FOREIGN PATENT DOCUMENTS

| KR | 1019990005138 A | 1/1999 |
|---|---|---|
| KR | 1020070028073 | 3/2007 |

OTHER PUBLICATIONS

Notice of Preliminary Rejection issued from Korean Intellectual Property Office on Mar. 30, 2010.
Notice of Allowance issued from Korean Intellectual Property Office on Oct. 28, 2010.

* cited by examiner

*Primary Examiner* — Lincoln Donovan
*Assistant Examiner* — Terry L Englund
(74) *Attorney, Agent, or Firm* — IP & T Group LLP

(57) ABSTRACT

An internal voltage generating circuit includes an internal voltage generating unit configured to generate an internal voltage that corresponds to a target voltage level by driving an internal voltage terminal with an external power supply voltage, and current sinking unit configured to adjust leakage current introduced to the internal voltage terminal in response to the external power supply voltage.

13 Claims, 4 Drawing Sheets

INTERNAL VOLTAGE GENERATOR

CROSS-REFERENCE TO RELATED APPLICATION

The present invention claims priority of Korean patent application number 10-2008-0110039, filed on Nov. 6, 2008, which is incorporated by reference in its entirety.

BACKGROUND OF THE INVENTION

The present invention relates to a semiconductor design technology, and more particularly, to an internal voltage generating circuit for generating a stable internal voltage.

Generally, in a semiconductor memory device such as a Double Data Rate Synchronous Dynamic Random Access Memory (DDR SDRAM), an internal voltage generating circuit may be mounted. More efficient power consumption management and more stable circuit operation of the semiconductor memory device can be obtained by using an internal voltage generated by the internal voltage generating circuit. Such an internal voltage includes a core voltage, a precharge voltage and a cell plate bias voltage that are generated by down-converting an external power supply voltage, a pumping voltage and a substrate bias voltage that are generated by pumping the external power supply voltage.

Meanwhile, as semiconductor memory devices have become more highly integrated, design-criteria for making memory devices with dimensions below sub-micron level are applied to the semiconductor memory device and an operational frequency of the semiconductor memory device is also increased. For these extremely minute elements to perform operations at a high frequency, the external power supply voltage is decreased. Therefore, an importance of an internal voltage generated by using such a lowered external power supply voltage is being stressed more.

FIG. 1 is a circuit diagram illustrating a core voltage generating circuit for generating a core voltage VCORE as an internal voltage of a conventional internal voltage generating circuit.

Referring to FIG. 1, the core voltage generating circuit includes a voltage comparing unit 110, an activating unit 130, a driving unit 150 and a voltage dividing unit 170.

The voltage comparing unit 110 compares a reference voltage VREFC with a feedback voltage VFED and activates the driving unit 150 in response to a result of the comparison. Here, the reference voltage VREFC has a voltage value that corresponds or is at least substantially equal to a target voltage level of the core voltage VCORE (hereafter, referred to as a target voltage level).

The activating unit 130 enables the voltage comparing unit 110 in response to an enabling signal EN. That is, the comparing unit 110 performs the operation of comparing the reference voltage VREFC with the feedback voltage VFED in response to the enabling signal EN.

The driving unit 150 drives a terminal outputting the core voltage VCORE with an external power supply voltage VDD in response to an output signal of the voltage comparing unit 110. Although it will be explained later in the following operation explanations, the core voltage VCORE is increased to the target voltage level which corresponds or is at least substantially equal to the reference voltage VREFC by the driving unit 150.

The voltage dividing unit 170 generates the feedback voltage VFED by dividing the core voltage VCORE.

An operation of the core voltage generating circuit is briefly described as follows.

Firstly, a first N-channel Metal Oxide Semiconductor (NMOS) transistor NM1 of the activating unit 130 is turned-on in response to the enabling signal EN of a logic high. Since the core voltage VCORE initially has a lower voltage level than the target voltage level (that is, VREFC), the feedback voltage VFED has a lower voltage level than the reference voltage VREFC initially. The voltage comparing unit 110 initially outputs a signal of a logic low (that is, a low voltage level signal) with the reference voltage VREFC and the feedback voltage VFED lower than the reference voltage VREFC. In response to the low signal output of the voltage comparing unit 110, a first P-channel Metal Oxide Semiconductor (PMOS) transistor PM1 of the driving unit 150 is turned-on. Therefore, a driving current which corresponds to the external power supply voltage VDD is introduced to the terminal outputting the core voltage VCORE, and as a result, the core voltage VCORE gradually increases.

The above described operation is repeated continuously while the core voltage VCORE is increased to the target voltage level.

Meanwhile, if the core voltage VCORE becomes higher than the target voltage level, the feedback voltage VFED has a voltage level higher than the reference voltage VREFC. The voltage comparing unit 110 outputs a signal of a logic high with the reference voltage VREFC and the feedback voltage VFED higher than the reference voltage VREFC. Thereafter, the first PMOS transistor PM1 of the driving unit 150 is turned-off in response to the output signal of a logic high (that is, a high signal) of the voltage comparing unit 110. Accordingly, a driving current from the external power supply voltage VDD is no longer provided to the terminal of the core voltage VCORE. As a result, the increase in the core voltage VCORE is stopped.

In other words, the core voltage generating circuit in FIG. 1 maintains the core voltage VCORE at the target voltage level (that is, at VREFC) by repeating the above-mentioned steps of operations. The core voltage VCORE generated in this manner is applied to an internal circuit (not shown in the drawing) of a semiconductor memory device.

Meanwhile, in supplying electric power to circuits, leakage current often occur in these circuits. For example, leakage current often occurs in core voltage generating circuits such as the core voltage generating circuit in FIG. 1. Ideally, in case that the enabling signal EN becomes a logic low so that the voltage comparing unit 110 is disabled or in case that the core voltage VCORE is increased to the target voltage level so that the first PMOS transistor PM1 of the driving unit 150 is turned-off, current should not flown in the first PMOS transistor PM1. However, in reality, leakage current often occurs in the first PMOS transistor PM1. Leakage current also occurs in the voltage dividing unit 170 and the internal circuit, to which the core voltage VCORE is applied.

FIG. 2 is a diagram showing leakage current that accompanies a core voltage generating circuit.

In FIG. 2, there illustrated a leakage current source 212 and a leakage current sinking source 214, that are components of a core voltage generating circuit 210, and a leakage current sinking logic 230 where sinking leakage current occurs in logics of an internal circuit that the core voltage VCORE is provided.

The leakage current source 212 sources leakage current to the terminal outputting the core voltage VCORE and, for example, corresponds to the driving unit 150 in FIG. 1. The leakage current sinking source 214 sinks leakage current from the terminal outputting the core voltage VCORE and corresponds to the voltage dividing unit 170 in FIG. 1. Leakage current sunken by the leakage current sinking logic 230 sinks leakage current from the terminal outputting the core voltage VCORE and corresponds to the internal circuit that the core voltage VCORE is provided. In other words, in general, the leakage current introduced from the leakage current source 212 is discharged through the leakage current sinking source 214 and through the leakage current sinking logic 230.

FIG. 3 is a diagram for explaining the introduced current and the discharged current in connection with FIG. 2.

Referring to FIGS. 1-3, initially, during a period when the core voltage VCORE is gradually increased toward the target voltage level, leakage current discharged to a ground voltage terminal, i.e., the leakage current discharged through the leakage current sinking source 214 and through the leakage current sinking logic 230, is increased in response to increase in the external power supply voltage VDD. Thereafter, if the driving unit 150 is turned off in response to the core voltage VCORE reaching the target voltage level, leakage current discharged to the ground voltage terminal becomes a relatively constant value.

Meanwhile, initially, during the period when the core voltage VCORE is being gradually increased toward the target voltage level, all of the current introduced from the external power supply voltage terminal, i.e., the current sourced through the first PMOS transistor PM1 of the driving unit 150, is used for increasing the core voltage VCORE. With respect to leakage current, since current from the external power supply voltage terminal is intended, almost no current introduced from the power supply voltage terminal to the terminal outputting the core voltage VCORE is considered to be leakage current. Thereafter, if the core voltage VCORE is increased to the target voltage, source leakage current flows through the first PMOS transistor PM1 even if the first PMOS transistor PM1 of the driving unit 150 is turned-off. At this time, the source leakage current becomes more intensive as a voltage level of the external power supply voltage VDD is increased.

In other words, as a voltage level of the external power supply voltage VDD is increased, the leakage current introduced to the terminal of the core voltage VCORE from the terminal of the power supply voltage VDD becomes larger than sinking leakage current discharged to ground voltage terminal from the terminal of the core voltage VCORE.

FIG. 4 is a diagram showing a relation between the leakage current and the core voltage VCORE shown in FIG. 3.

As shown, the core voltage VCORE is maintained at the target voltage level to some degree even if the external power supply voltage VDD is increased. However, as above-described in relation to FIG. 3, as the external power supply voltage VDD is gradually increased, leakage current introduced to the terminal of the core voltage VCORE from the terminal of the power supply voltage VDD becomes larger than leakage current discharged to the terminal of the ground voltage VSS from the terminal of the core voltage VCORE. As a result, because of the surplus leakage current introduced to the terminal of the core voltage VCORE that is not sunken as a sinking leakage current, a voltage level of the core voltage VCORE becomes higher than the target voltage level.

Such an operation where leakage current makes the core voltage VCORE to become higher than a target voltage value is not desirable in an internal voltage generating circuit, where maintenance of the internal voltage generated at predetermined target voltage level is desirable. Also, the increased core voltage VCORE due to the leakage current applies unnecessary stress to an internal circuit that uses the core voltage VCORE. In such a case, the lifetime of the internal circuit may be shortened.

SUMMARY OF THE INVENTION

The present invention according to an example is directed to providing an internal voltage generating circuit capable of discharging excess leakage current from an external power supply.

The present invention according to an example is also directed to providing an internal voltage generating circuit capable of generating a constant internal voltage regardless of an external power supply voltage.

In accordance with an aspect of the present invention, there is provided an internal voltage generating circuit, which includes an internal voltage generating unit configured to generate an internal voltage that corresponds to a target voltage level by driving an internal voltage terminal with an external power supply voltage, and a current sinking unit configured to adjust sinking leakage current from the internal voltage terminal.

In accordance with an aspect of the present invention, a constant voltage level of an internal voltage is kept regardless of an external power supply voltage by performing a current-sinking operation and controlling a sinking leakage current from an inner voltage terminal to ground. And, it is possible that an undesired decrease of an internal voltage due to a current-sinking operation of the current sinking unit is prevented by effectively operating the current sinking unit of the present invention. Despite processing variations, such as variations in voltages and temperature, a constant inner voltage may be maintained close to the target voltage level.

DESCRIPTION OF SPECIFIC EMBODIMENTS

In order to describe in detail such that those skilled in the art easily implement the spirit and scope of the present invention, the embodiments of the present invention will be described with reference to the accompanying drawings.

Figure 1:
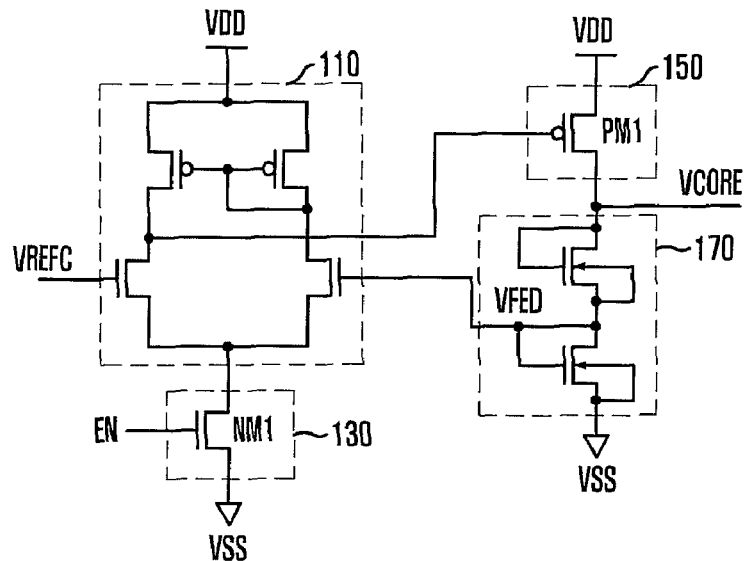
FIG. 1 is a circuit diagram illustrating a conventional internal voltage generating circuit.
Figure 2:
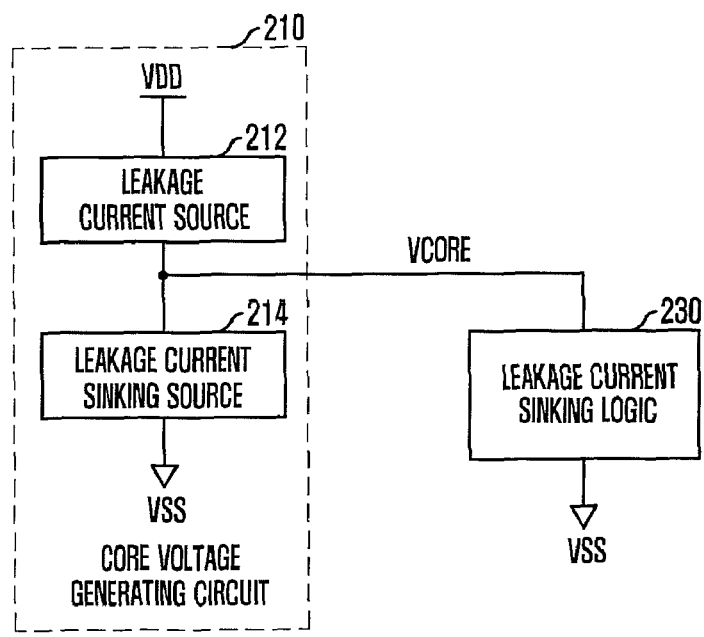
FIG. 2 is a diagram illustrating leakage current related to a core voltage generating circuit shown in FIG. 1.
Figure 3:
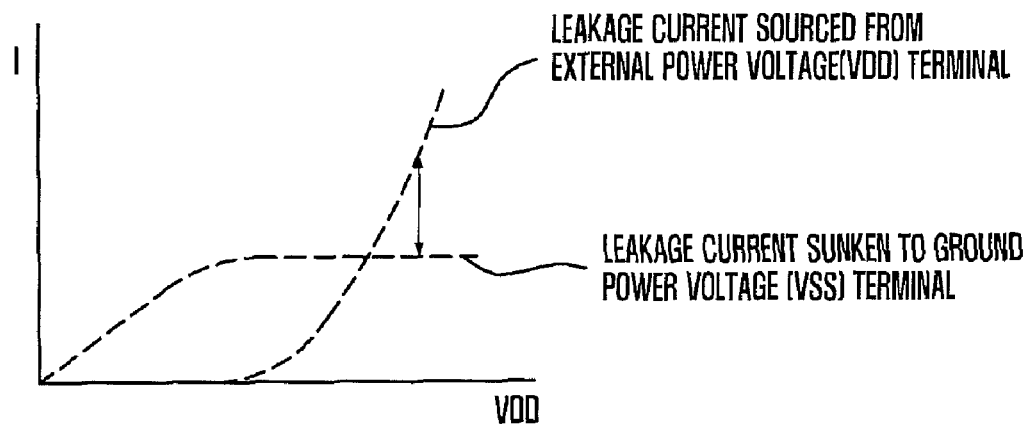
FIG. 3 is a diagram for explaining an introduced leakage current and a discharged leakage current in connection with FIG. 2.
Figure 4:
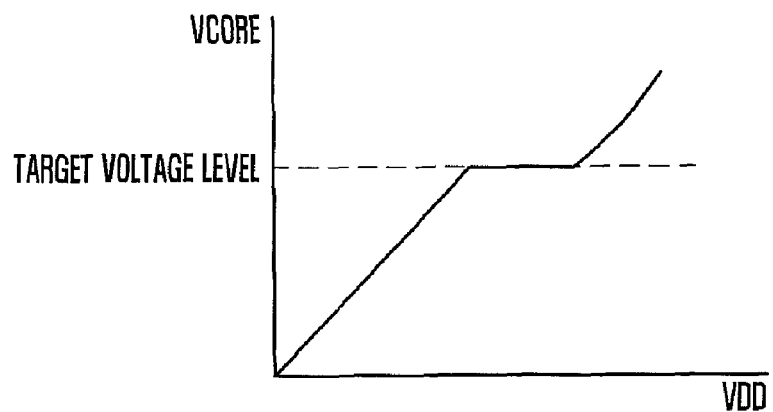
FIG. 4 is a diagram illustrating a relation between a leakage current and a core voltage VCORE shown in FIG. 3.
Figure 5:
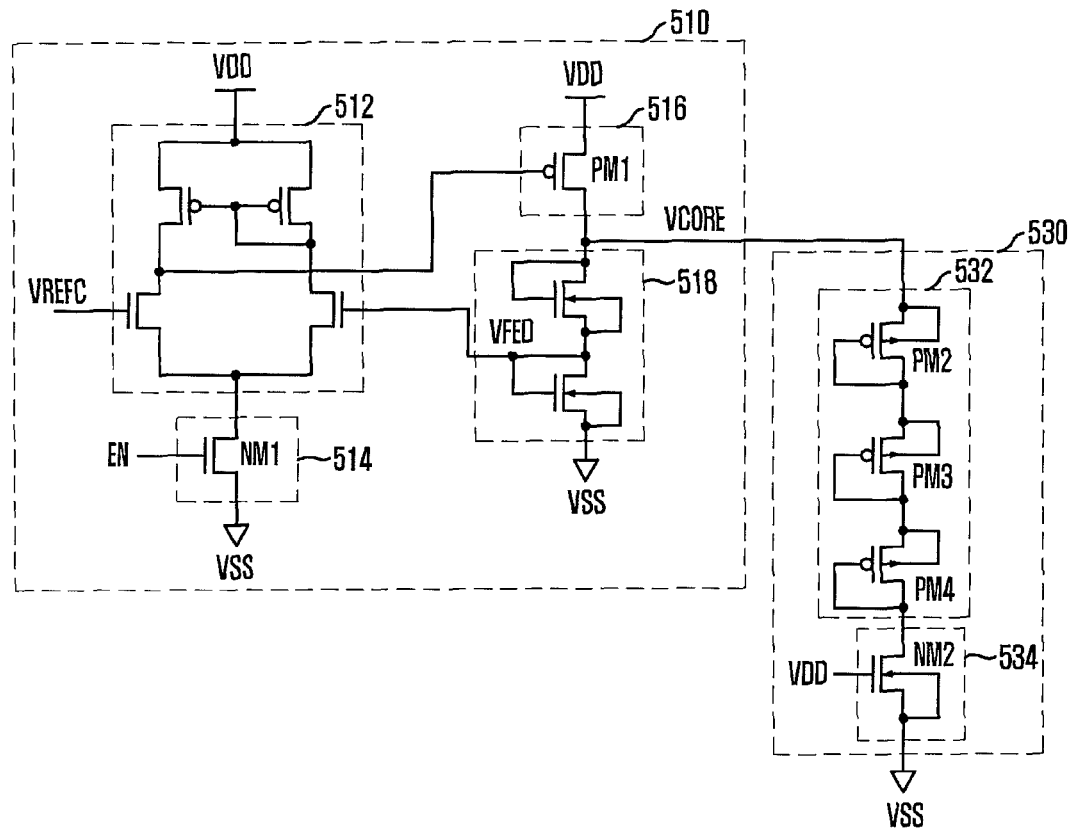
FIG. 5 is a circuit diagram depicting an internal voltage generating circuit in accordance with the present invention.

FIG. 5 is a circuit diagram depicting a core voltage generating circuit which generates a core voltage VCORE and is an internal voltage generating circuit in accordance with the present invention.

Referring to FIG. 5, the core voltage generating circuit includes a core voltage generating unit 510 and a current sinking unit 530.

The core voltage generating unit 510 serves to generate the core voltage VCORE which corresponds or is substantially equal to a target voltage level by driving a terminal of the core voltage VCORE with an external power supply voltage VDD and may be provided with a voltage comparing unit 512, an activating unit 514, a driving unit 516 and a voltage dividing unit 518.

The voltage comparing unit 512 compares a reference voltage VREFC with a feedback voltage VFED and turns on the driving unit 516 according to a result of the comparison. Here, the reference voltage VREFC may have a voltage level which corresponds to the target voltage level.

The activating unit 514 may turn on the voltage comparing unit 512 in response to an enabling signal EN. That is, the voltage comparing unit 512 performs the operation of comparing the reference voltage VREFC with the feedback voltage VFED in response to the enabling signal EN.

The driving unit 516 can drive the terminal of the core voltage VCORE with the external power supply voltage VDD in response to an output signal of the voltage comparing unit 512. Here, the driving unit 516 can be provided with a first PMOS transistor PM1 whose source-drain path is formed between the terminal of the power supply voltage VDD and the terminal of the core voltage VCORE and whose gate receives the output signal of the voltage comparing unit 512.

The voltage dividing unit 518 can generate the feedback voltage VFED by dividing the core voltage VCORE.

Meanwhile, the current sinking unit 530 serves to adjust an amount of a leakage current introduced to the terminal of the core voltage VCORE by varying a sinking leakage current in response to the external power supply voltage VDD. The current sinking unit 530 can be provided with an operation timing control unit 532 and a current control unit 534.

The operation timing control unit 532 serves to control a discharging timing of a sinking current flowed to the terminal of the core voltage VCORE and can be provided with second to fourth PMOS transistors PM2-PM4 connected between the terminal of the core voltage VCORE and the current control unit 534.

Here, although the operation timing control unit 532 is constructed with three diode-configured PMOS transistors, i.e., the second to fourth PMOS transistors PM2-PM4, it can be constructed with just one or more transistors according to an example. However, it is desirable that the operation timing control unit 532 has one or more transistors with each having an appropriate diode threshold voltage level to produce the target voltage level at an output node of the operation timing control unit 532. That is, a timing when a sinking leakage current from the terminal of the core voltage VCORE is sunken to the terminal of the ground voltage VSS in response to operations of the timing control unit 532 may be when the core voltage VCORE becomes higher than the target voltage level (e.g., VREFC). Therefore, during a period when the core voltage VCORE is lower than the target voltage level, a sinking current through the operation timing control unit 532 is not generated. However, during a period when the core voltage VCORE is higher than the target voltage level, a sinking leakage current through the operation timing control unit 532 is generated.

The current control unit 534 serves to control a sinking current through itself in response to the external power supply voltage VDD and can be provided with a second NMOS transistor NM2 connected between the operation timing control unit 532 and the ground voltage terminal. Therefore, in case that the external power supply voltage VDD is high, the current control unit 534 sinks more current to ground voltage terminal, and sinks less current to the ground voltage terminal in case that the external power supply voltage VDD is low. That is, the current control unit 534 can sink current which corresponds to the external power supply voltage VDD to the ground voltage terminal.

Meanwhile, it is desirable that the second to fourth PMOS transistors PM2-PM4 of the operation timing control unit 532 are designed to have the same physical characteristics in response to process variations as the first PMOS transistor PM1 of the driving unit 516. This is for offsetting a variation of an amount of current sunken through the first PMOS transistor PM1 according to process variations such as voltage and/or temperature variations. That is, in case that the current amount sunken through the first PMOS transistor PM1 is increased according to process variations such as voltage and/or temperature variations, current amount sunken through the second to fourth PMOS transistors PM2-PM4 can also be increased; in a case that the current amount sunken through the first PMOS transistor PM1 is decreased according to the process variations such as voltage and/or temperature variations, current amount sunken through the second to fourth PMOS transistors PM2-PM4 can be also decreased.

Now, an operation of the core voltage generating circuit in accordance with the present invention will be briefly described as follows.

Firstly, a first NMOS transistor NM1 of the activating unit 514 is turned-on in response to the enabling signal EN of a logic high. Since the core voltage VCORE initially has a lower voltage level than the target voltage level, the feedback voltage VFED has a lower voltage level than the reference voltage VREFC. The voltage comparing unit 512 outputs a signal of a logic low in response to the feedback voltage VFED being lower than the reference voltage VREFC. Thereafter, the first PMOS transistor PM1 of the driving unit 516 is turned-on in response to the output signal of a logic low of the voltage comparing unit 512. Therefore, a driving current from the external power supply voltage VDD flows to the terminal of the core voltage VCORE, and as a result, the core voltage VCORE is gradually increased.

Such an operation is continuously performed until the core voltage VCORE reaches the target voltage. During this time, the current sinking unit 530 does not perform the current sinking operation. That is, because of the threshold voltages of the second to fourth PMOS transistors PM2-PM4, the current sourced to the terminal of the core voltage VCORE is prevented from being discharged to the current sinking unit 530. This means that the current sourced to the terminal of the core voltage VCORE is not unnecessarily discharged by the current sinking unit 530 in accordance with the present invention.

Meanwhile, if the core voltage VCORE becomes higher than the target voltage level, the feedback voltage VFED has a higher voltage level than the reference voltage VREFC. The voltage comparing unit 512 outputs a signal of a logic high in response to the feedback voltage VFED being higher than the reference voltage VREFC. Thereafter, the first PMOS transistor PM1 of the driving unit 516 is turned-off in response to the output signal of a logic high of the voltage comparing unit 512. Therefore, driving current from the external power supply voltage VDD is no longer provided to the terminal of the core voltage VCORE, and as a result, the increase of the core voltage VCORE is stopped.

At this time, leakage current from the external power supply voltage VDD is introduced to the terminal of the core voltage VCORE, and the leakage current introduced to the terminal of the core voltage VCORE is discharged to the terminal of the ground voltage VSS by the current-sinking operation of the current sinking unit 530 in accordance with the present invention. If a voltage level of the external power supply voltage VDD is increased so that more leakage current is introduced, the current sinking unit 530 can discharge the source leakage current to the terminal of the ground VSS.

Figure 6:
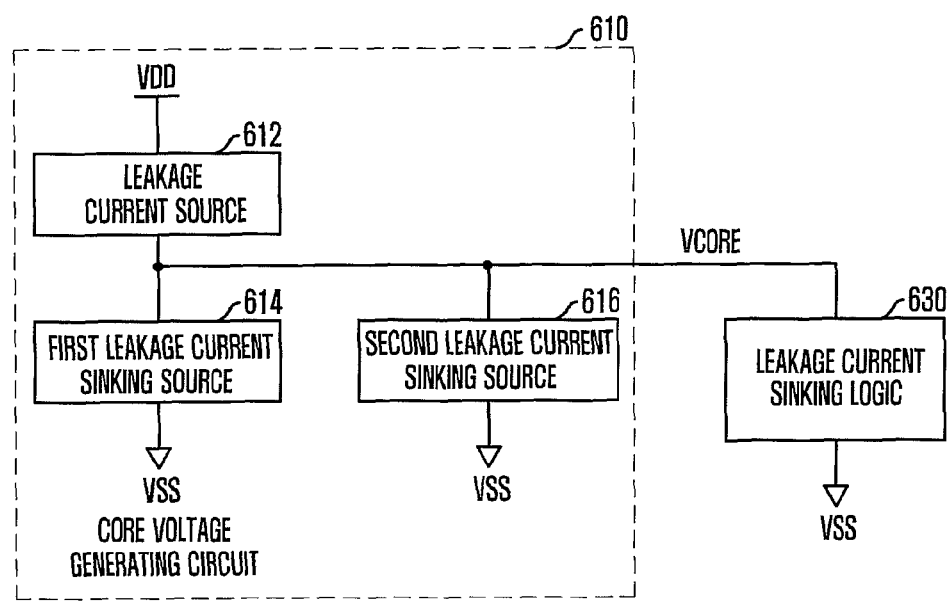
FIG. 6 is a diagram illustrating a leakage current in connection with a core voltage generating circuit shown in FIG. 5.

FIG. 6 is a diagram illustrating the leakage current in connection with the core voltage generating circuit shown in FIG. 5.

In FIG. 6, illustrates a leakage current source 612, a first leakage current sinking source 614 and a second leakage current sinking source 616, that are in a core voltage generating circuit 610, and a sinking leakage current caused by a leakage current sinking logic 630 in a logic of an internal circuit that the core voltage VCORE is applied. In the present invention, the second leakage current sinking source 616 is additionally included.

The leakage current source 612 is a part from which leakage current is introduced to the terminal of the core voltage VCORE, and the driving unit 516 shown in FIG. 5 corresponds to this part. The first leakage current sinking source 614 is a part to which the leakage current is discharged from the terminal of the core voltage VCORE, and the voltage dividing unit 518 shown in FIG. 5 corresponds to this part. The second leakage current sinking source 616 is a part through which the leakage current excessively introduced to the terminal of the core voltage VCORE is discharged, and the current sinking unit 530 corresponds to this part. Lastly, the leakage current sinking logic 630 is another part through which leakage current is discharged from the terminal of the core voltage VCORE, and forms a part of an internal circuit to which the core voltage VCORE is applied corresponds to this part (not shown in the drawing).

As a result, in accordance with the present invention, by discharging excessive leakage current excessively introduced to the terminal of the core voltage VCORE to the terminal of the ground voltage VSS by adding the second leakage current sinking source 616, it is possible to always generate a constant core voltage VCORE regardless of the external power supply voltage VDD.

Figure 7:
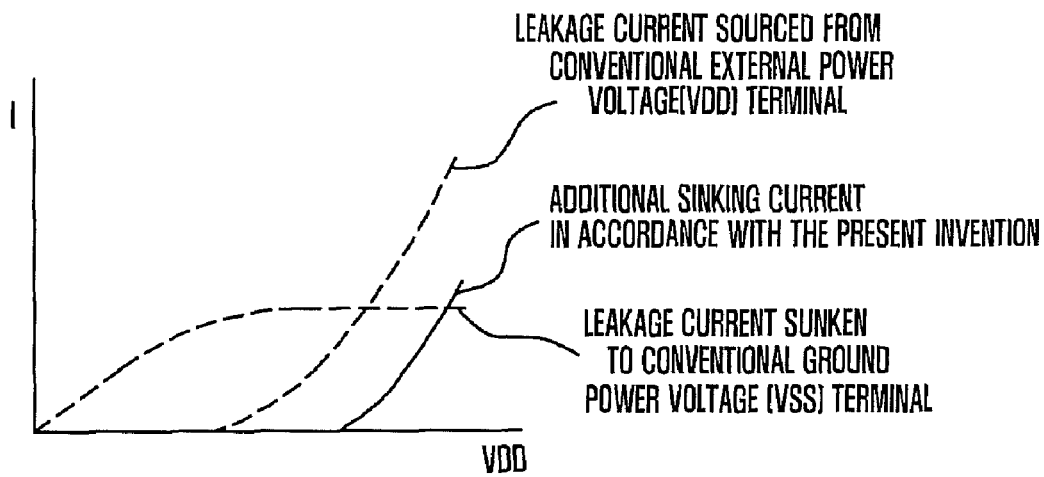
FIG. 7 is a diagram illustrating an introduced leakage current and a discharged leakage current in connection with FIG. 5.

FIG. 7 is a diagram illustrating source leakage current and a sinking leakage current in FIG. 5.

Referring to FIGS. 5-7, initially, during the period when the core voltage VCORE is increased toward the target voltage level, all of the current introduced from the external power supply voltage VDD, i.e., the current flown through the first PMOS transistor PM1 of the driving unit 516, is used for increasing the core voltage VCORE. That is, since all of the current from the external power supply voltage VDD is desired during the period, there is almost no leakage current introduced to the terminal of the core voltage VCORE from the terminal of the external power supply voltage VDD. Thereafter, in response to the core voltage VCORE reaching the target voltage, leakage current is introduced to the terminal of the power supply voltage VDD even if the first PMOS transistor PM1 of the driving unit 516 is turned-off. At this time, the source leakage current from the power supply voltage VDD becomes more intensive as a voltage level of the external power supply voltage VDD is increased.

Meanwhile, initially, during the period when the core voltage VCORE is increased toward the target voltage level, the leakage current discharged to the terminal of the ground voltage VSS, i.e., leakage current discharged from the first leakage current source 614 and leakage current caused by the leakage current sinking logic 630, is increased following the external power supply voltage VDD. Thereafter, if the driving unit 516 is disabled in response to the core voltage VCORE reaching the target voltage level, leakage current discharged through the voltage dividing unit 518 to the terminal of the ground voltage VSS becomes constant.

As above-mentioned, as a voltage level of the external power supply voltage VDD is increased, leakage current introduced to the terminal of the core voltage VCORE from the terminal of the external power supply voltage VDD becomes larger than leakage current discharged through the voltage dividing unit 518 to the terminal of the ground voltage VSS from the terminal of the core voltage VCORE. At this time, the second leakage current sinking source 616 in accordance with the present invention is enabled to additionally discharge the current flowing to the terminal of the core voltage VCORE to the terminal of the ground voltage VSS. That is, the excessive leakage current introduced to the terminal of the core voltage VCORE is discharged to the terminal of the ground voltage VSS.

Figure 8:
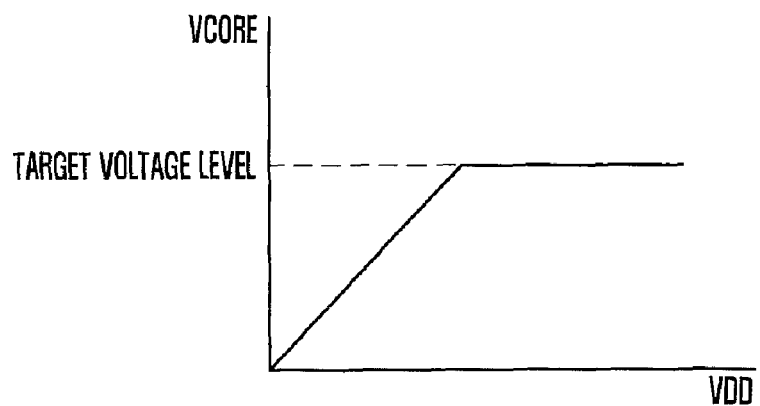
FIG. 8 is a diagram illustrating a relation between a leakage current and a core voltage VCORE shown in FIG. 7.

FIG. 8 is a diagram illustrating a relation between the leakage current and the core voltage VCORE shown in FIG. 7.

As shown in the drawing, the core voltage VCORE is kept at the target voltage level to some degree even if the external power supply voltage VDD is increased. Even if the external power supply voltage VDD is increased, since leakage current introduced to the terminal of the core voltage VCORE from the terminal of the external power supply voltage VDD is substantially tracked by or equal to leakage current discharged to the terminal of the ground voltage VSS, the core voltage VCORE is maintained at more or less at the target voltage.

As a result, in accordance with the present invention, the core voltage VCORE can always keep at least a substantially constant voltage level regardless of a voltage level of the external power supply voltage VDD. Also, since excess stress is not applied to an internal circuit that uses this core voltage VCORE, the lifetime of the internal circuit can be prolonged. Furthermore, with efficient current-sinking operations, unwanted loss of in accuracy of the core voltage VCORE can be prevented, and even if process variations such as voltage and/or temperature variations occur, a constant core voltage VCORE corresponding to the target voltage level may be generated.

The present invention generates a constant internal voltage regardless of fluctuations in an external power supply voltage such that an internal circuit using the internal voltage is not subjected to excessive stress to thus increase the lifetime of the internal circuit.

And also, the present invention may generate at least substantially constant internal voltage corresponding to a target voltage level despite process variations such as voltage and/or temperature variations.

While the present invention has been described with respect to the specific embodiments, it will be apparent to those skilled in the art that various changes and modifications may be made without departing from the spirit and scope of the invention as defined in the following claims.

Also, while the core voltage VCORE has been used as an example of an internal voltage in the above-described embodiments, the present invention is also applicable to generating internal voltages other than the core voltage VCORE.

Furthermore, the arrangement and types of the logic gates and transistors used in the above-mentioned embodiments may be modified according to polarity of an inputted signal.

What is claimed is:
1. An internal voltage generating circuit, comprising:
an internal voltage generating unit configured to generate an internal voltage by driving an internal voltage terminal with an external power supply voltage; and a current sinking unit configured to adjust, in response to the external power supply voltage, which is permanently applied to the current sinking unit, leakage current at the internal voltage terminal;

wherein the current sinking unit is enabled in response to the internal voltage being higher than a target voltage level.

2. The internal voltage generating circuit of claim 1, wherein the internal voltage is a core voltage.

3. The internal voltage generating circuit of claim 1, wherein the current sinking unit includes:

a sinking current control unit configured to control, in response to the external power supply voltage, current sunken through the sinking current control unit; and an operation timing control unit configured to control a discharging timing of the current sunken through the sinking current control unit.

4. The internal voltage generating circuit of claim 3, wherein the operation timing control unit is connected between the internal voltage terminal and the sinking current control unit and is provided with at least one first MOS transistor.

5. The internal voltage generating circuit of claim 3, wherein the operation timing control unit has a threshold voltage corresponding to the target voltage level.

6. The internal voltage generating circuit of claim 1, wherein a current sunken through the current sinking unit is sunken to a ground voltage terminal.

7. The internal voltage generating circuit of claim 4, wherein the internal voltage generating unit includes:

a voltage comparing unit configured to compare a reference voltage that corresponds to the target voltage level with a feedback voltage;

a driving unit configured to drive the internal voltage terminal with the external power supply voltage in response to an output signal of the voltage comparing unit; and a voltage dividing unit configured to generate the feedback voltage by dividing the internal voltage.

8. The internal voltage generating circuit of claim 7, wherein the driving unit is connected between an external power supply voltage terminal and the internal voltage terminal and is provided with a second MOS transistor controlled by the output signal of the voltage comparing unit.

9. The internal voltage generating circuit of claim 8, wherein the at least one first MOS transistor and the second MOS transistor have the same physical characteristics in response to processing variations.

10. The internal voltage generation circuit of claim 1, wherein the current sinking unit includes a plurality of diode-connected transistors and a MOS transistor that is connected between the plurality of diode-connected transistors and a ground voltage terminal and has a gate electrode coupled to the external power supply voltage.

11. A method of providing an internal voltage from an internal voltage generation circuit comprising:

using an output of a comparator to drive a current source coupled to an internal voltage terminal, wherein the comparator compares a reference voltage with a feedback voltage, and the comparator and current source output the internal voltage at the internal voltage terminal;

using a voltage divider coupled to the internal voltage terminal to divide the internal voltage and provide the feedback voltage; and sinking leakage current sourced through the current source by using a diode chain and a transistor, wherein the transistor is coupled between the diode chain and a ground voltage terminal and has a gate electrode coupled to an external power supply voltage, which is permanently applied to the transistor.

12. The method of claim 11, wherein the diode chain has a plurality of PMOS transistors that are connected in series.

13. The method of claim 11, wherein the transistor turns on as the external power supply voltage is increased and the diode chain starts to conduct when the internal voltage becomes greater than the reference voltage.

* * * * *